United States Patent [19]

Hongoh et al.

[11] Patent Number: 5,179,498
[45] Date of Patent: Jan. 12, 1993

[54] ELECTROSTATIC CHUCK DEVICE

[75] Inventors: Toshiaki Hongoh, Yamanashi; Masaki Kondo, Nirasaki, both of Japan

[73] Assignee: Tokyo Electron Limited, Tokyo, Japan

[21] Appl. No.: 687,552

[22] Filed: Apr. 19, 1991

[30] Foreign Application Priority Data

May 17, 1990 [JP] Japan .................................. 2-127581
Nov. 30, 1990 [JP] Japan .................................. 2-335669

[51] Int. Cl.⁵ .......................................... H02N 13/00
[52] U.S. Cl. ....................................... 361/234; 269/8; 269/903; 279/128
[58] Field of Search ............... 361/230, 233, 234, 235; 269/8, 903; 279/128

[56] References Cited

U.S. PATENT DOCUMENTS

| | | | |
|---|---|---|---|
| 4,558,334 | 12/1985 | Fotland | 361/230 |
| 4,692,836 | 9/1987 | Suzuki | 361/234 |
| 4,751,609 | 6/1988 | Kasahara | 361/234 |
| 5,001,594 | 3/1991 | Bobbio | 361/234 |

FOREIGN PATENT DOCUMENTS 59-79545  5/1984  Japan .

Primary Examiner—Jeffrey A. Gaffin
Attorney, Agent, or Firm—Oblon, Spivak, McClelland, Maier & Neustadt

[57] ABSTRACT

The present invention provides an electrostatic chuck device with a strong chucking force for use in an ion injection apparatus, an etching apparatus, a sputtering apparatus, an CVD apparatus, etc., which require electrostatic chucking. The chuck device is capable of easily loading/unloading an object to be chucked and providing sure grounding for a semiconductor wafer. To this purpose, three-phase AC voltages of 1 Hz or less with different phases are applied, and contact pins with pointed tips are provided.

6 Claims, 4 Drawing Sheets

THREE-PHASE AC VOLTAGE

ELECTROSTATIC CHUCK DEVICE

BACKGROUND OF THE INVENTION

1. Field of the Invention

The present invention relates to an electrostatic chuck device.

2. Description of the Related Art

In general apparatuses for manufacturing semiconductor devices, a vacuum chuck is employed as a means for holding a object to be processed, for example a semiconductor wafer.

In a vacuum treatment apparatuses such as an ion injection apparatus or a plasma etching apparatus, it is necessary to hold and treat a semiconductor wafer in a vacuum atmosphere. Thus, it is not possible to use the vacuum chuck as adsorption/holding means.

Means for electrostatic chucking semiconductor wafers in a vacuum are disclosed, for example, in Published Unexamined Japanese Patent Application (PUJPA) No. 59-79545, PUJPA No. 60-197335, PUJPA No. 62-29140, PUJPA No. 63-95644, Published Examined Japanese Patent Application (PEJPA) No. 1-36707, and PEJPA No. 1-52899.

According to one of the above apparatuses, first and second adsorbing sections are provided on the adsorption surface of a holding base, and a DC voltage is applied between the electrodes of the first and second adsorbing sections. In this apparatus, dielectric polarization is caused to occur in a dielectric layer interposed between the semiconductor wafer and electrodes. By virture of the van der Waals force due to the dielectric polarization, the semiconductor wafer is attracted and held. According to another of the above apparatuses, a single-phase alternating current is applied for an electrostatic chuck device between an electrode and a semiconductor wafer, or between electrodes of first and second electrostatic chucking sections.

According to an apparatus wherein a DC voltage is applied between a wafer and an electrode or between two electrodes, an attraction force (Coulomb force) is strong, but dielectric polarization occurs in dielectric material at the surface. THus, even after the application of voltage is stopped, the charge remains on the electrostatic chucked face and the chucked object is not easily separated from the chucking/holding base. Besides, dust or the like is easily attached to the semiconductor wafer which is the held object.

On the other hand, if an AC voltage, in lieu of the DC voltage, is applied, the amount of dust attached to the chucked object can be reduced. In addition, since no dielectric polarization occurs in dielectric material, the chucked object is immediately separated from the chucking/holding base upon the turning-off of voltage application between electrostatic chucks. In the prior art disclosed in the above prior art documents, however, what is applied is the single-phase AC voltage; therefore, sufficient attraction force cannot be obtained. Because the single-phase AC voltage takes a zero value instantaneously at every regular cycle, and the chucking force is lost at the instantaneous zero voltage time.

SUMMARY OF THE INVENTION

The present invention has been made in consideration of the above circumstances, and its object is to provide an electrostatic chuck device with a strong chucking force, which is capable of using an AC voltage as a voltage to be applied and of being sufficiently cooled.

This invention also provides an electrostatic chuck device capable of providing a predetermined voltage, for example, sure grounding for a semiconductor wafer.

In order to achieve the above object, there is provided an electrostatic chucking device having a surface to be contacted with an object to be chucked with at least the surface being made of dielectric material, comprising, electrodes disposed below or within the dielectric material, wherein AC voltages are applied to the electrodes thereby chucking the object by an electrostatic chucking force, wherein there is no time period in which all AC voltages applied to the electrodes take zero values.

Specifically, AC voltages having three or more different phases are applied between three or more electrodes for electrostatic chucking, so as to prevent the applied chucking voltage from taking a zero value instantaneously. Thus, a relatively strong electrostatic chuck force is obtained.

In the case of, e.g. an ion injection apparatus wherein a chucking holder serves also as a cooling mechanism, a very strong chucking force is required. In such a case, plural phase AC voltages of at least three phases, which have the frequency of 1 Hz or less, are applied to the electrodes. In addition, contact pins with pointed tip portions are arranged within a support member of the chuck device.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

First Embodiment

A first embodiment of the present invention, 20 wherein an electrostatic chucking device of the invention is applied to a high-current type ion injection apparatus, will now be described with reference to the accompanying drawings.

Figure 5:
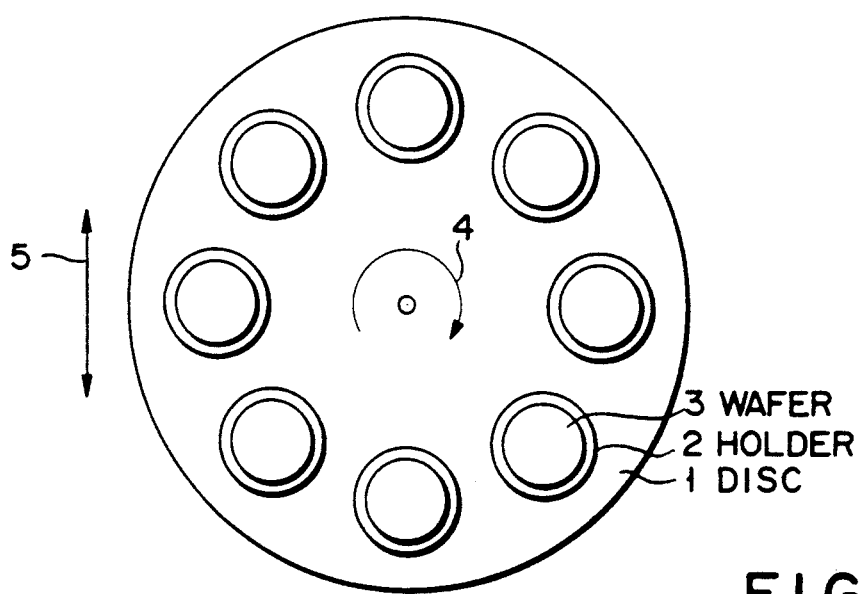
FIG. 5 is a view for explaining an important part of an ion injection apparatus to which the present invention is applied.

As is shown in FIG. 5, the high-current type ion injection apparatus is designed to reduce the quantity of heat generated at the time of ion injection to a desired portion. Specifically, a plurality of semiconductor wafer holders 2 are arranged on a disc 1 in the circumferential direction of the disc 1. The disc 1 is situated in a vacuum chamber. Semiconductor wafers 3 are placed on the holders 2. The disc 1 is rotated about its center axis in the direction of, e.g. arrow 4. In addition, the disc 1 is moved linearly and reciprocally in the direction of, e.g. arrow 5. Thus, ions are injected in the semiconductor wafers 3 at a time.

Figure 1:
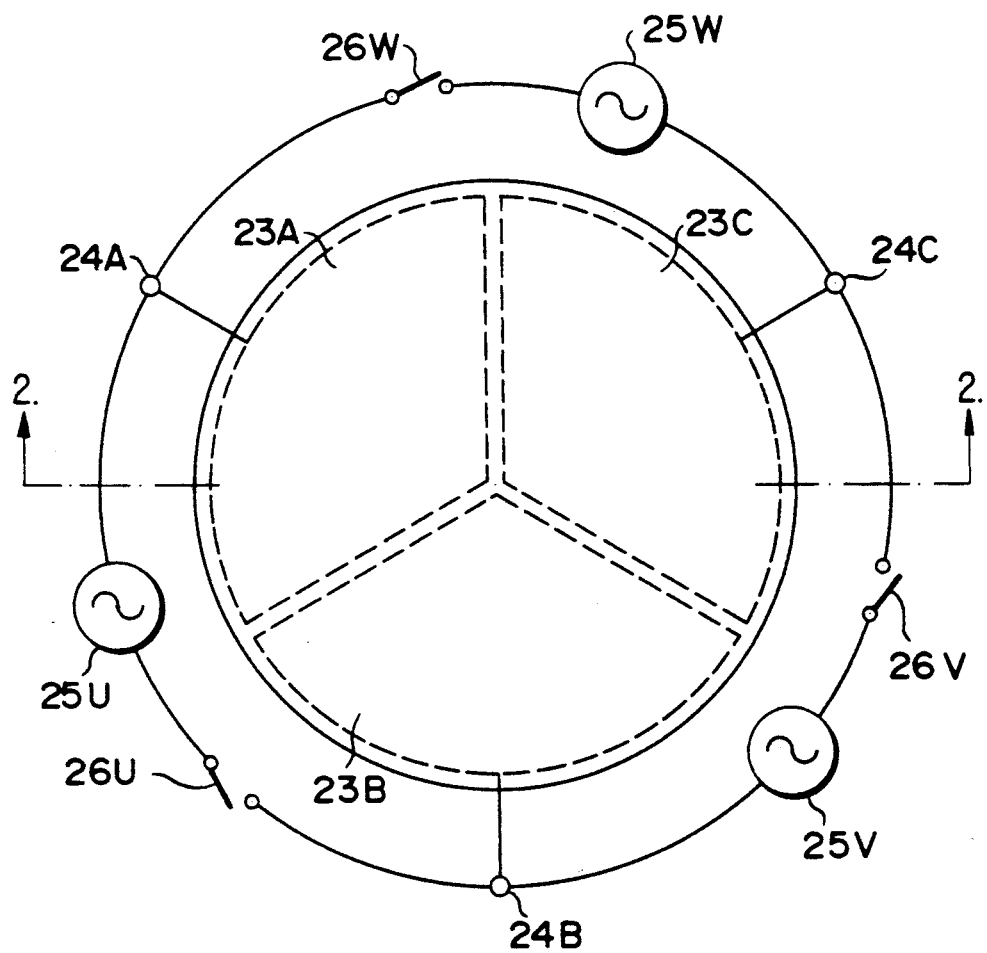
FIG. 1 is a plan view showing the structure of an electrostatic chuck device according to a first embodiment of the present invention.
Figure 2:
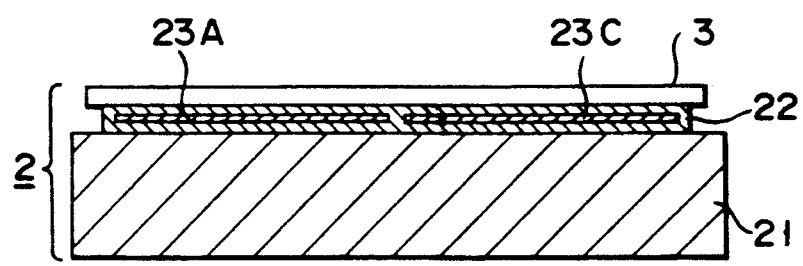
FIG. 2 is a cross-sectional view taken along line 2—2 in FIG. 1.

Each holder 2 has an electrostatic chucking mechanism for provisional fixation. As is shown in the cross-sectional view of FIG. 2, a dielectric material portion 22 formed of a plastic material such as polyimide is provided on a base 21 formed of, a material which surface has at least dielectric property e.g. silicone rubber. Within the dielectric materia portion 22, there are provided means for eliminating the instantaneous time at which the applied voltage decreases to zero while the wafer is chucked. In this embodiment, as is shown in FIG. 1, three sectorial electrode layers 23A, 23B and 23C each having a 120° angular distance are embedded in the dielectric material portion 22 as such means. Thus, the dielectric material portion 22 has a sandwich-like structure. In this first embodiment, the thickness of the dielectric material portion 22, including the electrode layers, is set to be about 25 μm, for example.

Terminals 24A, 24B and 24C are connected to the electrode layers 23A, 23B and 23C. A series circuit of a power source 25U, which generates an AC voltage EU shown in FIG. 4A, and a switch 26U is connected between the terminals 24A and 24B of each of the holders 2 on the disc 1. A series circuit of a power source 25V, which generates an AC voltage EV (differing in phase by 120° from AC voltage EU) shown in FIG. 4B, and a switch 26V is connected between the terminals 24B and 24C of each holder 2. A series circuit of a power source 25W, which generates an AC voltage EW (differing in phase by 240° from AC voltage EU) shown in FIG. 4C, and a switch 26W is connected between the terminals 24C and 24A of each holder 2. A commercial three-phase AC power source can be used for the power sources 25U, 25V and 25W.

The switches 26U, 26V and 26W are interlocked and, for example, when the wafer 3 is mounted on the holder 2, these switches are turned on. When the switches 26U, 26V and 26W are turned on, the AC voltages EU, EV and EW are applied between the electrode layers 23A, 23B and 23C. Consequently, an electric charge is generated in the wafer 3 or a conductor through the dielectric material portion 22 by electrostatic induction, the wafer is chucked and provisional by fixed by Coulomb force.

Figure 4:
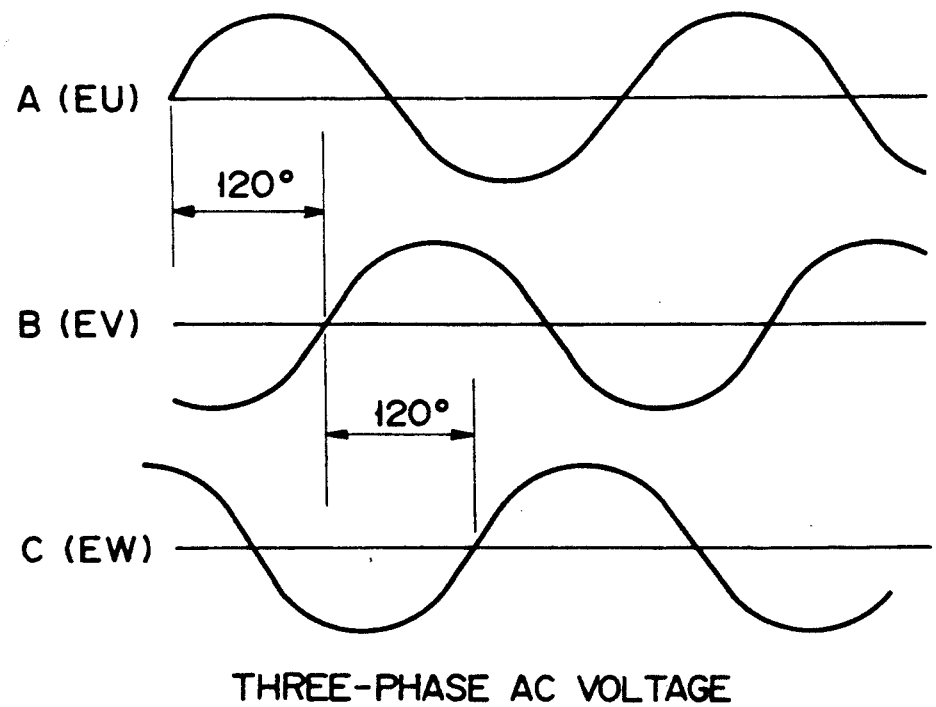
FIG. 4 shows AC voltages having different phases.

The voltage applied to the eectrode layers 23A, 23B and 23C is a three-phase AC voltage, as shown in FIG. 4. Thus, unlike the single-phase AC voltage, the voltage never takes a zero value and an electrostatic chucking force of a sufficient strength can be obtained.

The base 21 of the holder 2 may be formed of aluminum or ceramic material. However, where the base 21 is formed of an elastic material such as silicone rubber, as stated above, there is the following advantage. When a warp appears on the wafer 3, the base 21 can deform in accordance with the shape of the wafer 3 since the interposed dielectric body 22 functions as a very thin flexible plate. Thus, despite the warp on the wafer 3, no gap is produced between the wafer 3 and the holder 2, and a chucking force of a predetermined strength or more can be attained.

The provisional fixation can be released by setting the chucking voltage to zero. This chucking charge of insulating body surface is discharged and releases its provisional fixation.

The number of electrodes and the number of AC voltages having different phases may be four or more.

In the first embodiment, the number of regions at which electrostatic chucking voltages are applied for chucking the wafer is three; however, this number is changeable only if the voltage to be applied for chucking the wafer does not become zero. For example, a multi-phase AC voltage may applied to a single electrode, unless the voltage becomes zero.

Second Embodiment

Figure 3:
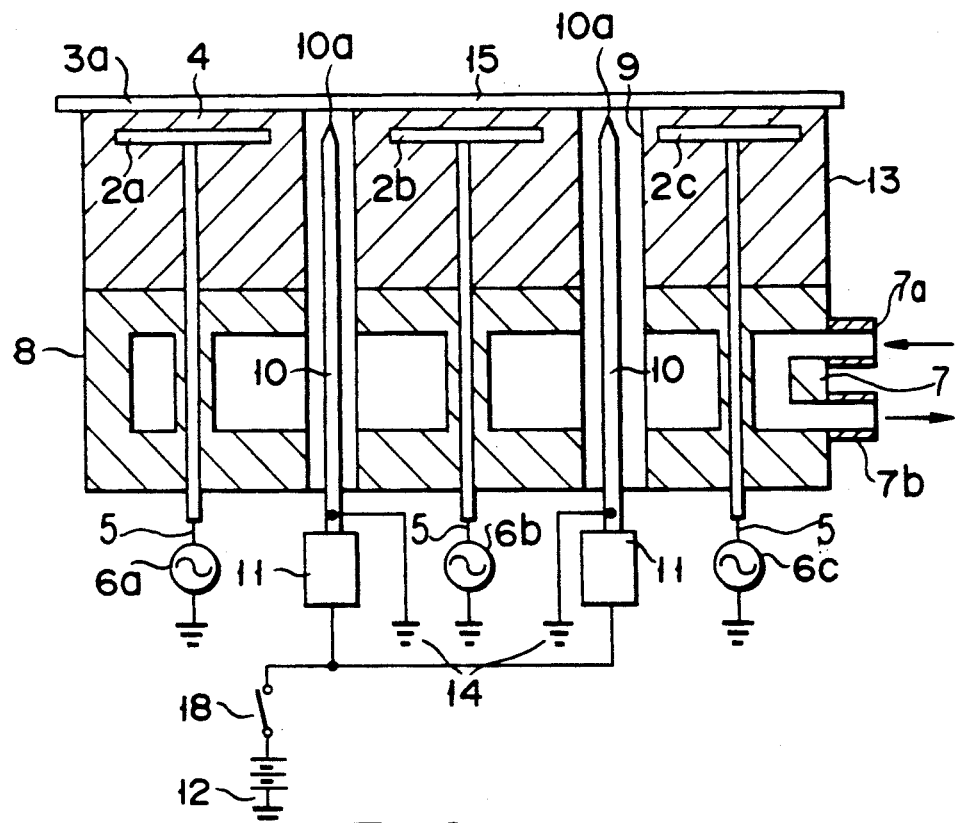
FIG. 3 is a cross-sectional view showing the structure of an electrostatic chuck device according to a second embodiment of the invention.

As is shown in FIG. 3, an electrostatic chuck device 1 according to a second embodiment of the present invention has an electrostatic chuck body 13 made of an insulative material such as alumina or silicone rubber, in which a plurality of, for example, three, electrodes 2a, 2b and 2c are embedded. An upper surface 3a of the body 13 serves as a mount surface on which an object to be chucked e.g. a semiconductor wafer, is mounted. A dielectric body 4 is interposed between this wafer mount surface 3a and the electrodes 2a, 2b and 2c.

Electrode terminals 5 are connected to the electrodes 2a, 2b and 2c. The electrodes 2a, 2b and 2c are connected to power sources 6a, 6b and 6c via the terminals 5. The power sources 6a, 6b and 6c generate voltages, e.g. three-phase AC voltages having the same frequency and different phases differing from each other by 120°. Switch circuits (not shown) are connected between the power sources 6a, 6b and 6c and the electrodes 2a, 2b and 2c. A commercial three-phase AC power source, for example, may be used for the power sources 6a, 6b and 6c.

A cooling structure 8 containing a cooling jacket 7 is provided under the chuck body 13. A cooling water is supplied into the cooling jacket 7 through a cooling water intake- pipe 7a, thereby cooling the electrostatic chuck body 13. The cooling water is discharged through a cooling water discharge pipe 7b.

A plurality of through-holes 9, extending up to the upper surface 3a or semiconductor wafer mount surface of the body 13, are formed in the body 13 and the cooling structure 8. Contact pins 10 formed of stainless steel, tungsten, etc. are disposed within the through-holes 9. The contact pins 10 function to supply the semiconductor wafer chucked on the body 13 with an electric potential, for example, a ground potential. A tip portion 10a of each contact pin 10 is sharp, for example, with a size of about 5 μm to 100 μm.

The contact pins 10 are vertically movable by means of solenoids 11 or the like. The tip portion 10a of each pin 10 is sharpened so as to be able to break the insulative surface layer of the wafer when it is pressed on the chucked wafer. The solenoids 11 are operated by a power source 12 and a switch 18 for solenoids. The means for applying an urging force to the contact pins 10 and vertically move the pins 10 are not limited to the mechanical means such as solenoids; for example, the contact pins 10 may be disposed rubber materials or springs.

The contact pins 10 are connected to ground potentials or power sources, depending on the type of the treatment apparatus to be employed. In this embodiment, the pins 10 are connected to ground potentials 14.

The electrostatic chuck device 6 with the above structure can be used as a transferring/holding device in an ion injection apparatus, a plasma etching apparatus, a sputtering apparatus or other vacuum treatment apparatus, or as a holder for holding an object (e.g. semiconductor wafer) to be transferred by a transferring apparatus i the air.

The operation of the electrostatic chuck device 6 will now be described.

When a semiconductor wafer 15 is mounted on the upper surface 3a of the electrostatic chuck body 13, a three-phase AC voltage of, e.g. 1 Hz or less, is applied from the power sources 6a, 6b and 6c to the electrodes 2a, 2b and 2c. In this case, the potential of the semiconductor wafer 15 is about half the potential between the electrodes 2a, 2b and 2c. The potential difference between the wafer 15 and electrodes 2a, 2b and 2c generates an chuckinq force (aspiration force) due to Coulomb force. Consequently, the semiconductor wafer 15 is closely chucked on the upper surface 3a of the body 13.

Since the three-phase AC voltage of such a low frequency as 1 Hz or less is applied, the inversion of voltage is delayed and a van der Waals force, as well as the Coulomb force, is simultaneously generated. As a result, as is shown in FIG. 6, an chucking force of, e.g. about 50 g/cm$^2$ which is adequate as an chucking force of a holding device with a cooling mechanism for use in various types of vacuum treatment apparatuses.

Figure 7:
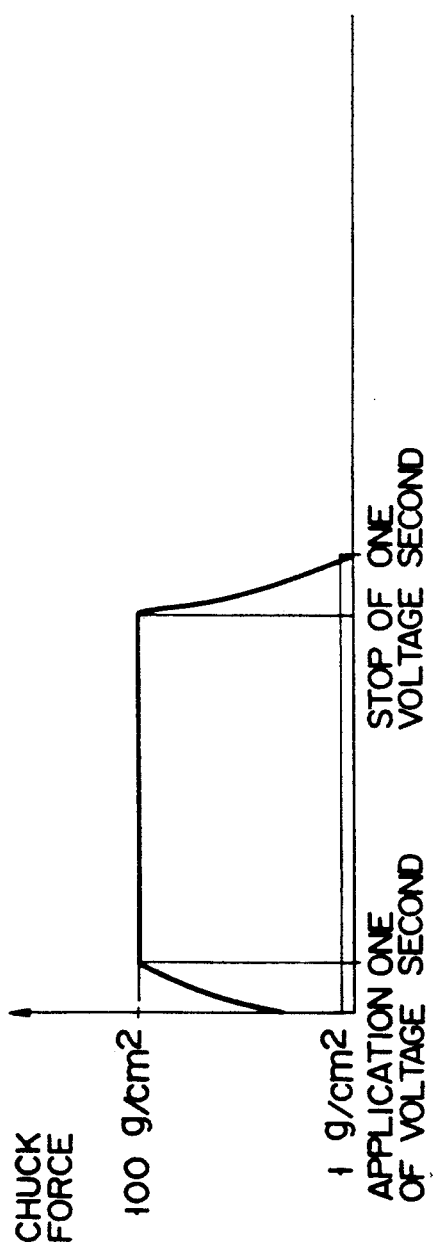
FIG. 7 is a graph showing responsiveness of electrostatic chucking force in relation to time, at the time a plural phase AC voltage of a low frequency is applied between electrodes.

Since the van der Waals force does not increase, unlike the case where DC voltage is applied, the semiconductor wafer 15 can be separated (unloaded) about one second after the voltage is turned off. FIG. 7 shows the relationship between the chucking force and the operation time, where a three-phase AC voltage of 0.5 Hz is applied to enable the body 13 to the semiconductor wafer and then stopped to unload the wafer.

Figure 6:
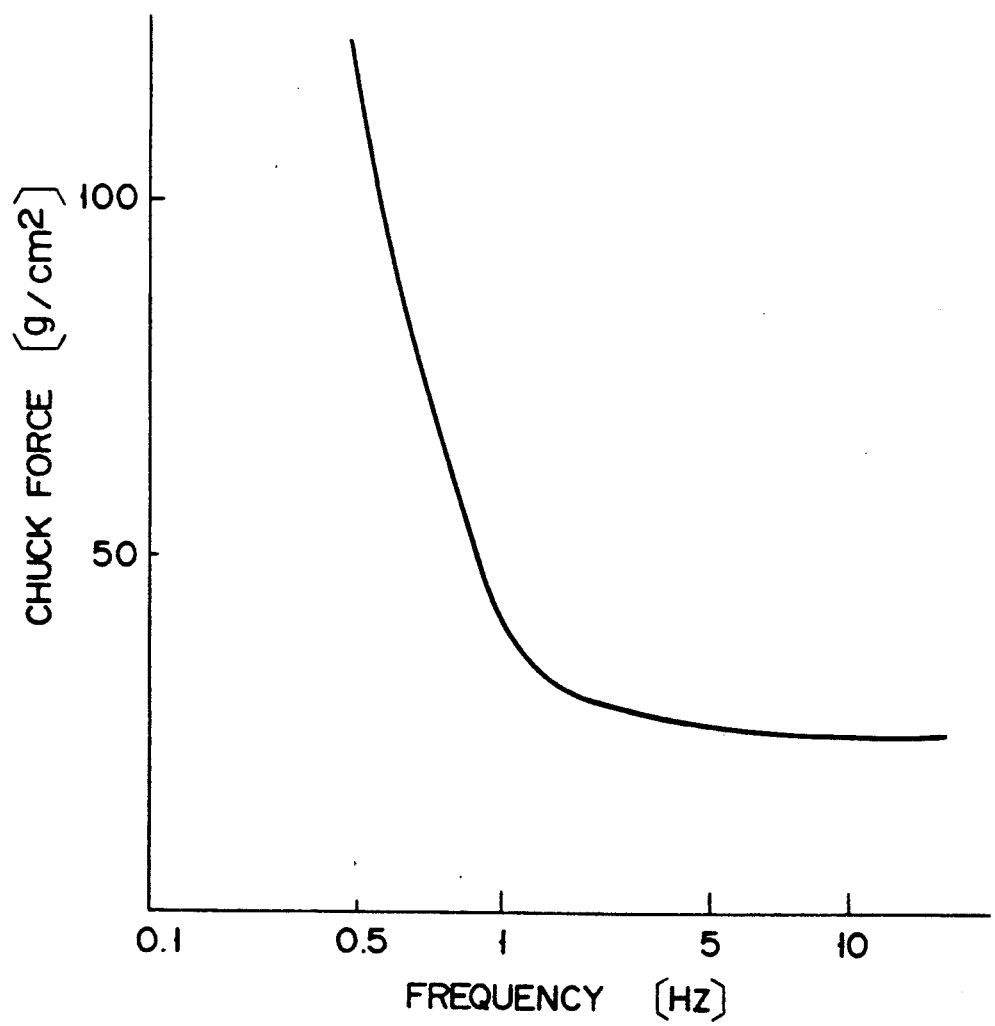
FIG. 6 is a graph showing a relationship between a frequency and an chucking force at the time a multiphase AC voltage is employed.

As is clear from FIG. 6, the chucking force is sharply increased by applying the three-phase AC voltage of 0.5 Hz (less than "1 Hz") to the electrodes 2. Thus, the characteristic shown in FIG. 7 is obtainable, and the easy unloading of wafers is possible by stopping the supply of chucking voltage for chucking release.

Since the three-phase AC voltage is applied to the electrodes 2a, 2b and 2c, less dust adheres to the semiconductor wafer 15 to be chucked.

Figure 8:
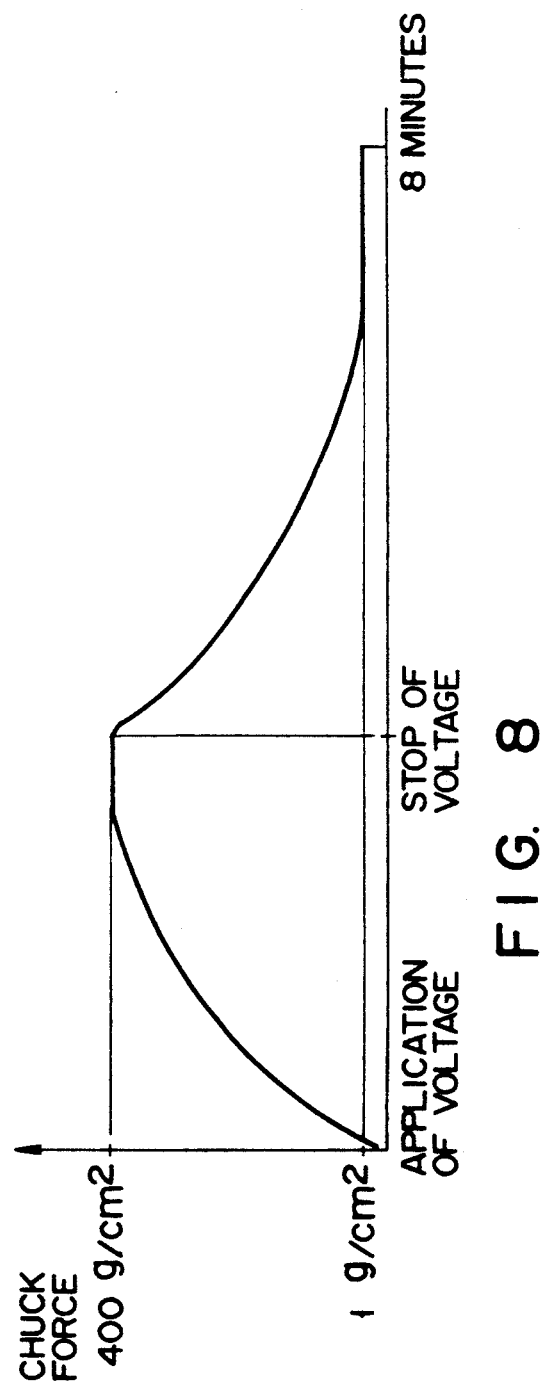
FIG. 8 is a graph showing responsiveness of electrostatic chucking force in relation to time, at the time a DC voltage is applied between electrodes.

When a three-phase AC voltage of 50 Hz is applied to the electrodes 2 of the above electrostatic chuck device, an chucking force due to Coulomb force is generated. This chucking force is about 10 g/cm$^2$, it is not possible to chuck, for exampe, warped semiconductor wafer 15 with a sufficient contact area. Consequently, sufficient heat conduction with the cooling structure 8 is not possible and, for example, the semiconductor wafer 15 is not sufficiently cooled.

Where different DC voltages are applied to the three electrodes 2a, 2b and 2c of the above electrostatic chuck device (e.g. +1200 V to electrode 2a, −600 V to electrode 2b, and −1000 V to electrode 2c), dielectric polarization occurs in the dielectric ayer 4, and a strong chucking force of about 400 g/cm$^2$ is generated by van der Waals force. However, the van der Waals force due to DC voltages has a bad response/time characteristic, and the semiconductor wafer cannot be unloaded until several minutes pass after the voltage is stopped. FIG. 8 shows responsiveness of chucking force in rela tion to time, at the time a DC voltage is applied.

About the grounding of the semiconductor wafer, the following structure can be employed.

When the solenoid control switch 18 is closed, the power supply to the solenoids 11 is stopped, and the solenoids 11 are raised. The tip portions 10a of the contact pins 10 are pressed on the lower surface of the semiconductor surface 15 with a suitable pressure. Even if an oxide layer is formed on the surface of the wafer 15, the sharp tip portions 10a of pins 10 can break the oxide layer and ensures electrical conduction with the wafer 15.

The urging force of the contact pins 10 is suitably determined in the pre-treatment for the semiconductor wafer 15 to be treated. It is sufficient that the pressure at the tip portion 10a is about 100g.

In the electrostatic chuck device 1 having the above structure, the contact pins 10 with sharp tip portions 10a are pressed on the lower surface of the semiconductor wafer 15, thereby ensuring electrical conductivity with the wafer 15. For example, where an oxide layer is formed on the surface of the wafer 15, the electrical connection with the wafer 15 can be ensured. For example, if the contact pins 10 are connected to ground potentials 14, the grounding for the semiconductor wafer 15 can be ensured. If the contact pins 10 are connected to desired power sources, electric power of a desired value can be applied.

In the above embodiment, the three-phase AC voltage was applied to the three electrodes 2a, 2b and 2c; however, the number of electrodes and the number of phases of plural phase AC voltage may be four or more. In addition, a single-phase AC or DC can be applied. The object to be chucked is not limited to the semiconductor wafer; various types of electrically conductive objects may be employed.

Needless to say, the device is applicable to a device which electrostaticaly chucks in the above manner, and a chucked body is provided in the vacuum circumstances or particular gas circumstance. For example a plasma etching apparatus, a plasma CVD apparatus, an ion injection apparatus, a sputtering apparatus, or a wafer prober.

Chucked body is not limited to semiconductor wafer LCD substrate, printed substrate but a chucked body for provisional fixation processed in particular gas circumstances.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electrostatic chuck device having a surface to be contacted with an object to be held, with at least said surface being made of a dielectric material, comprising:
    an electrode assembly having plural electrode members disposed below or within said dielectric material;
    wherien AC voltages are applied to each of the electrode members thereby holding the object by an electrostatic force, said AC voltages are plural phase AC voltages, the number of said electrode members corresponds to the number of phases of the AC voltages, the plural phase AC voltages with different phases are applied to the electrode members, and an electric voltage is applied to at least one of said electrode membes in each cycle, so that there is no point in any one cycle where the whole electric voltage applied to the electrode member as a whole becomes zero.

2. The electrostatic chuck device according to claim 1, wherein said electrode assembly has at least three electrode members and a three-phase AC electric voltage is applied to each of said electrode members.

3. The electrostatic chuck device according to claim 2, wherein said plural phase AC voltages have a frequency of no more then 1 Hz and are applied to each of the electrode members.

4. The electrostatic chuck device according to claim 1, wherein said electrode assembly has three electrode members whose areas are equal.

5. The electrostatic chuck device according to claim 1, wherein said electrode assembly has three electrode members which are formed in the same shape.

6. An electrostatic chuck device comprising:
a support member having a surface to be contacted with an object to be chucked, with at least said surface being made of a dielectric material; and
an electrode assembly having plural electrode members provided within said support member, for holding said object by an electrostatic holding force, with said dielectric material interposed between said object and each of said electrode members;
wherein contact pins with pointed tip portions are arranged within said support member and the tip portions of the contact pins are to be pressed on the lower surface of the object thereby breaking a layer on the surface of the body and ensuring electrical connection with said dielectric material.

* * * * *